United States Patent [19]
DeSimone

[11] Patent Number: 5,112,230
[45] Date of Patent: May 12, 1992

[54] RECONFIGURABLE SUBSTRATE FOR ELECTRIC CIRCUIT CONNECTIONS

[75] Inventor: Michael J. DeSimone, Mansfield, Tex.

[73] Assignee: Motorola, Inc., Schaumburg, N.Y.

[21] Appl. No.: 728,460

[22] Filed: Jul. 11, 1991

Related U.S. Application Data

[63] Continuation-in-part of Ser. No. 639,771, Jan. 14, 1991, abandoned, which is a continuation of Ser. No. 524,716, May 17, 1990, abandoned, which is a continuation of Ser. No. 391,262, Aug. 2, 1989, abandoned.

[51] Int. Cl.⁵ .................................................. H05K 1/00
[52] U.S. Cl. ...................................... 439/55; 439/516; 29/847; 174/261
[58] Field of Search .................. 29/847; 174/254, 261; 439/43, 55, 189, 516

[56] References Cited

U.S. PATENT DOCUMENTS

| | | | |
|---|---|---|---|
| 3,492,628 | 1/1970 | Matthews | 439/84 |
| 4,471,158 | 9/1984 | Roberts | 439/516 |
| 4,592,606 | 6/1986 | Mudra | 439/516 |
| 4,593,959 | 6/1986 | Simms | 439/516 |
| 4,689,023 | 8/1987 | Strong, III et al. | 439/516 |

Primary Examiner—Gary F. Paumen
Attorney, Agent, or Firm—Darleen J. Stockley

[57] ABSTRACT

A reconfigurable substrate is provided for supporting electrical elements. A conductive strip is disposed on the substrate for linking at least two electrical elements. The substrate has a portion has a portion proximate to the strip for permitting subsequent removal thereof, thereby severing the conductive strip. Thus, a connection of electrical elements may be selectively varied as a function of specification of options which become operative by subsequent removal of a portion of the substrate proximate to the conductive strip.

14 Claims, 1 Drawing Sheet

RECONFIGURABLE SUBSTRATE FOR ELECTRIC CIRCUIT CONNECTIONS

This is a continuation-in-part of application Ser. No. 639,771, filed Jan. 14, 1991, now abandoned, which is a continuation of Ser. No. 524,716, filed May 17, 1990, now abandoned, which is a continuation of Ser. No. 391,262, filed Aug. 9, 1989, now abandoned.

BACKGROUND OF THE INVENTION

This invention relates in general to electric circuit connections and more particularly to connections modified to provide for post-assembly disconnection.

It is desirable to use one substrate to manufacture different models or types of electrical devices. This approach necessitates, however, making alternative connections or disconnections after assembly. Typically this may be done by soldering or unsoldering jumper wires. This is time-consuming and subject to error.

SUMMARY OF THE INVENTION

Accordingly, the present invention provides a transformable circuit connection adaptable for rapid modification and a method which overcomes the foregoing deficiencies.

In one embodiment, a substrate is provided with a severable connective strip. A portion of the substrate is designed for subsequent removal. Removal of this substrate portion severs the strip.

BEST MODE FOR CARRYING OUT THE INVENTION

Figure 1:
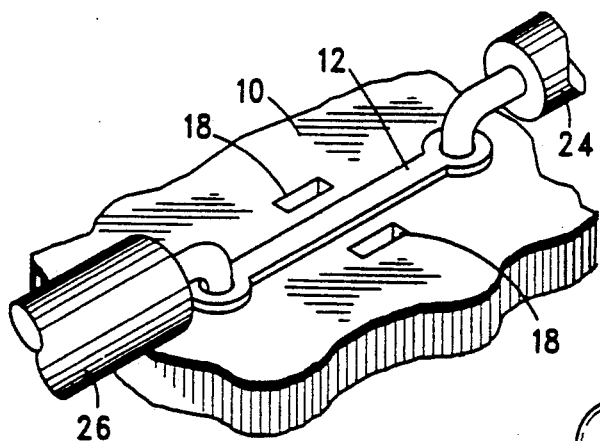
FIG. 1 is a perspective view of a substrate for supporting two electrical elements according to the invention.
Figure 3:
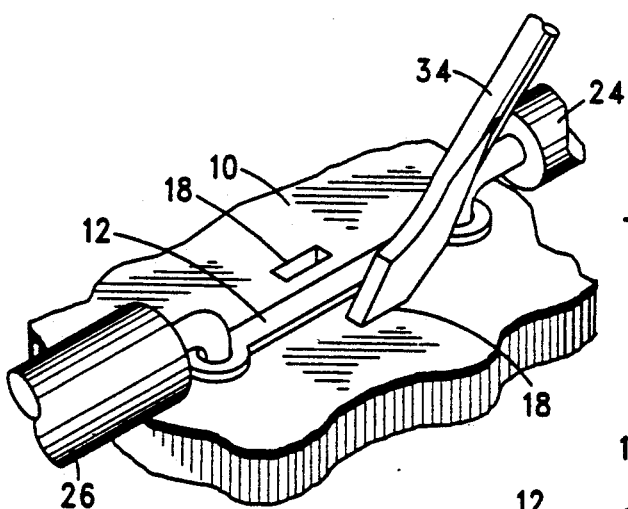
FIG. 3 is a perspective view of a tool insertion according to one embodiment of the invention.
Figure 4:
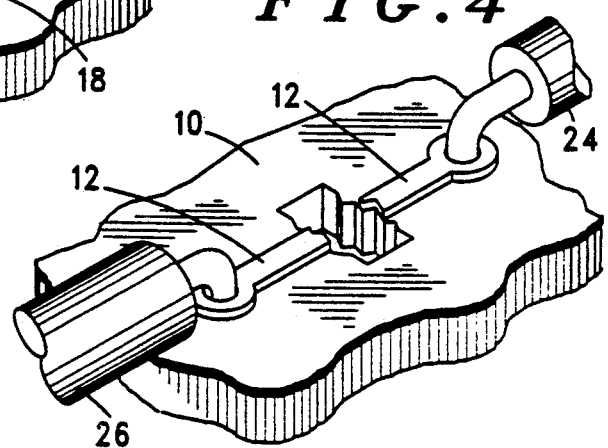
FIG. 4 is a top plan view of a broken path due to severance of conductive strip.

FIG. 1 depicts a reconfigurable substrate (10) that supports at least two electrical elements (24 and 26) that are intended to alter at least one of: frequency, current, voltage, and resistance to which circuit connections may be made. A conductive strip (12) is also disposed therebetween, with apertures (18) lying parallel and proximate thereto. The apertures (18) are of the appropriate length and width for a tool (such as a screwdriver blade (34) as shown in FIG. 3) or other suitable instrument to be inserted therein. Punching or twisting of the tool breaks out a portion of the substrate (10) proximate the apertures and supporting a portion of conductive strip (12), severing a proximate portion of the respective conductive strip (12) and the electrical connection between at least two electrical elements (24 and 26) on the substrate that are intended to alter at least one of: frequency, current, voltage, and resistance, without removing an edge of the substrate, as shown in FIG. 4.

In the preferred embodiment, the reconfigurable substrate (10) may be a printed circuit board, a substrate in an integrated circuit, a hybrid thereof, or any circuit base adaptable for subsequent removal of a portion of the substrate without removing an edge of the substrate, said reconfigurable substrate having at least two electrical elements on the substrate that are intended to alter at least one of: frequency, current, voltage and resistance. The conductive strip (12) may be a metallic conductor such as gold, silver, or copper, a semiconductor, or a superconductor.

Figure 2:
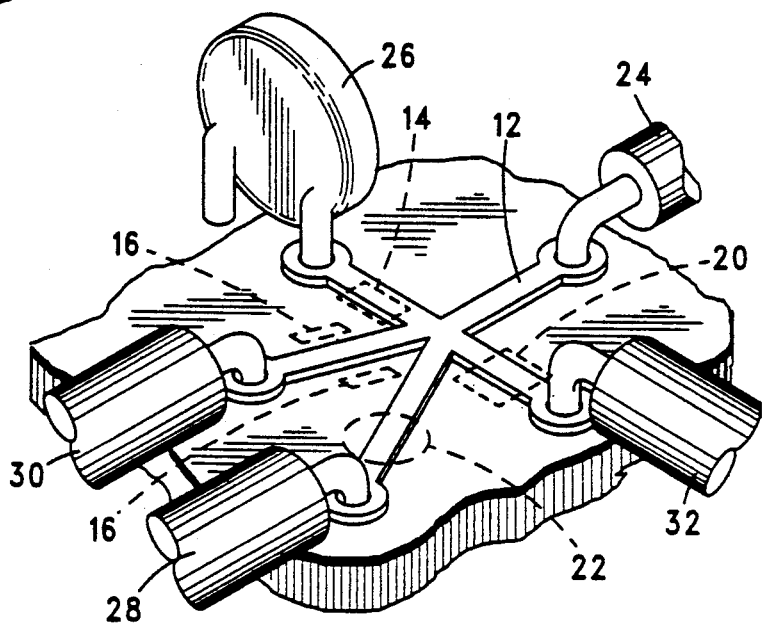
FIG. 2 is a top plan view of a substrate for supporting a plurality of electrical elements according to the invention.

FIG. 2 depicts adaptations of the substrate (10) to accommodate a plurality of options of circuit element disconnections. Subsequent removal of a portion of the substrate supporting a portion of conductive strip (12) severs the conductive strip (12) proximate thereto and thus breaks the electrical circuit between at least two electrical elements (26, 28, 30, and/or 32) on the substrate that are intended to alter at least one of frequency, current, voltage, and resistance. One adaptation is perforation of the border, or a portion thereof, of part (14 and 20) of the substrate (10), which may lie directly beneath the conductive strip (12) or may extend beyond the edges of the conductive strip (12). Another adaptation is perforation of portions (16) of substrate (10) which are parallel to and on either side of the conductive strip. A further adaptation is a depression or weakening of a portion (22) of the substrate (10). In each of these adaptations of the substrate (10), application of pressure by a tool will break out the adapted area of the substrate (10) and, at times, part of the substrate (10) immediately proximate thereto, severing the conductive strip (12) and disconnecting the electrical contacts connected thereby.

Accordingly what is claimed is:

1. A substrate that supports at least two electrical elements that are substantially intended to alter at least one of: frequency, current, voltage, and resistance, comprising:

A) a conductive strip disposed on the substrate which connects at least two said electrical elements; and
    B) the substrate having at least one edge and a portion supporting a portion of the strip, the substrate constructed and weakened to facilitate subsequent removal of the supporting portion, thereby severing the conductive strip without removing a portion of the edge of the substrate.

2. A substrate as recited in claim 1, wherein:

the substrate has an aperture formed therethrough adjacent to and on both sides of the strip, facilitating the subsequent removal of the supporting portion.

3. A substrate as recited in claim 1, wherein:

the supporting portion of the substrate is surrounded on two sides thereof by apertures formed through the substrate, allowing the subsequent removal of the supporting portion.

4. A substrate as recited in claim 1, wherein:

the supporting portion is surrounded on two sides thereof by sections of the substrate which are substantially less thick than the remainder of the substrate, allowing the subsequent removal of the supporting portion.

5. A substrate as recited in claim 1, wherein:

the substrate has apertures substantially parallel to and on either side of the conductive strip, allowing the subsequent removal of the supporting portion.

6. A method for severing a conductive strip on a substrate which supports at least two electrical elements that are substantially intended to alter at least one of: frequency, current, voltage, and resistance, the substrate having at least one edge, the conductive strip connecting the at least two electrical elements, comprising the steps of:

A) weakening a portion of the substrate supporting a portion of the strip for subsequent removal of the supporting portion; and B) removing the supporting portion of the substrate, thereby severing the conductive strip without removing an edge of the substrate.

7. A method for severing a conductive strip as recited in claim 6, wherein:

the weakening step is performed by perforating a portion of the substrate proximate to the conductive strip to allow the subsequent removal of the supporting portion of the substrate and the portion of the conductive strip associated therewith.

8. A method for severing a conductive strip as recited in claim 6, wherein:

the weakening step is performed by reducing the thickness of a portion of the substrate proximate to the conductive strip, thus allowing the subsequent removal of the supporting portion of the substrate and the portion of the conductive strip associated therewith.

9. A method for severing a conductive strip as recited in claim 6 wherein:

the weakening step is performed by forming apertures proximate to either side of the conductive strip in the substrate.

10. A substrate that supports electrical elements that are substantially intended to alter at least one of: frequency, current, voltage, and resistance, comprising:

A) a plurality of conductive strips disposed on the substrate, each conductive strip connecting at least two said electrical elements on the substrate; and B) the substrate having at least one edge and portions of the substrate each supporting a respective portion of a respective said conductive strip, each supporting portion constructed and weakened to allow subsequent removal of the supporting portion and the portion of the respective conductive strip, thereby severing the conductive strip portion without removing the edge of the substrate.

11. The substrate of claim 10, wherein a portion of the substrate proximate to each conductive strip portion has at least one aperture formed therethrough for facilitating subsequent removal of the supporting portions and of the conductive strip portion.

12. The substrate of claim 10, wherein a portion of the substrate proximate to each conductive strip portion is substantially surrounded on two sides thereof by apertures formed through the substrate, facilitating the subsequent removal of the supporting portions and of the conductive strip portions.

13. The substrate of claim 10, wherein a portion of the substrate proximate to each conductive strip portion is substantially less thick than the substrate generally, facilitating the subsequent removal of the supporting portion of the substrate and of the conductive strip portions.

14. The substrate of claim 10, wherein a portion of the substrate proximate to each conductive strip portion has apertures formed therethrough substantially parallel to and on either side of the conductive strip portion, facilitating the subsequent removal of the supporting portions of the substrate and of the conductive strip portions.

* * * * *

UNITED STATES PATENT AND TRADEMARK OFFICE
CERTIFICATE OF CORRECTION

PATENT NO.   : 5,112,230
DATED        : May 12, 1992
INVENTOR(S)  : Michael J. DeSimone It is certified that error appears in the above-indentified patent and that said Letters Patent is hereby corrected as shown below:

On the Title page, item [73], Assignee: "Schaumburg, N.Y." should be --Schaumburg, Ill.--.

Signed and Sealed this

Twenty-eighth Day of September, 1993

Attest:

BRUCE LEHMAN

*Attesting Officer*            *Commissioner of Patents and Trademarks*